(12) United States Patent
Oooka et al.

(10) Patent No.: US 7,622,861 B2
(45) Date of Patent: Nov. 24, 2009

(54) ORGANIC ELECTROLUMINESCENT DISPLAY DEVICE HAVING TWO SEALED EL DISPLAY PANELS

(75) Inventors: Hiroshi Oooka, Mobara (JP); Shinichi Kato, Mobara (JP); Masamitsu Furuie, Mobara (JP); Masato Ito, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 46 days.

(21) Appl. No.: 11/055,500

(22) Filed: Feb. 11, 2005

(65) Prior Publication Data

US 2005/0179378 A1 Aug. 18, 2005

(30) Foreign Application Priority Data

Feb. 17, 2004 (JP) .............................. 2004-039232

(51) Int. Cl.
*H01J 1/62* (2006.01)
*H01J 63/04* (2006.01)
(52) U.S. Cl. ..................... 313/504; 313/506; 313/512
(58) Field of Classification Search .......... 313/498–512
See application file for complete search history.

(56) References Cited

U.S. PATENT DOCUMENTS

| | | | | |
|---|---|---|---|---|
| 7,030,552 | B2* | 4/2006 | Chao et al. | 313/504 |
| 7,106,001 | B2* | 9/2006 | Kim et al. | 313/512 |
| 2001/0020818 | A1* | 9/2001 | Uchida et al. | 313/504 |
| 2001/0044035 | A1* | 11/2001 | Morii | 428/690 |
| 2003/0020401 | A1* | 1/2003 | Park et al. | 313/512 |
| 2004/0075628 | A1* | 4/2004 | Chien et al. | 345/82 |
| 2004/0119407 | A1* | 6/2004 | Kim et al. | 313/512 |
| 2004/0212300 | A1* | 10/2004 | Chao et al. | 313/506 |

FOREIGN PATENT DOCUMENTS

| | | |
|---|---|---|
| JP | 10-208884 | 8/1998 |
| JP | 2001-92390 | 4/2001 |
| JP | 2001-345184 | 12/2001 |
| JP | 2002-252089 | 9/2002 |
| JP | 2002-289362 | 10/2002 |

* cited by examiner

*Primary Examiner*—Bumsuk Won
(74) *Attorney, Agent, or Firm*—Antonelli, Terry, Stout & Kraus, LLP.

(57) ABSTRACT

In an organic EL display panel, one sealing substrate is shared between two organic EL substrates, thereby achieving thinning and lightening of the panel body. The display panel includes a sealing substrate having a first concave portion and a second concave portion opposite the first concave portion, a first transparent glass substrate hermetically sealed on the first concave portion, a first organic light emitting element formed on a surface of the first transparent glass substrate, a first desiccant disposed on a bottom surface of the first concave portion, a second transparent glass substrate hermetically sealed on a the second concave portion, a second organic light emitting element formed on a surface of the second transparent glass substrate, a second desiccant disposed on a surface of the second concave portion, wherein the first organic light emitting element and the second organic light emitting element achieve a shared use of the sealing substrate.

3 Claims, 7 Drawing Sheets

ORGANIC ELECTROLUMINESCENT DISPLAY DEVICE HAVING TWO SEALED EL DISPLAY PANELS

CROSS-REFERENCE TO RELATED APPLICATIONS

The disclosure of Japanese Patent Application No. JPP2004-039232, filed on Feb. 17, 2004, including the specification, drawings and abstract, is incorporated herein by reference in its entirety.

BACKGROUND

The present invention relates in general to an organic EL display device. The invention especially relates to a two-sided display type organic EL display device of the type used for flip phones etc., which includes a main EL display panel and a sub EL display panel, which is disposed on the back side of the main EL display panel. More specifically, the invention relates to an organic EL display device including an absorbent layer(s) having hygroscopic and deoxidizing functions, which protects organic EL display devices disposed within the organic display panel from the external atmosphere.

As miniaturization has progressed in the design of cellular phones and PDAs (personal digital assistance) having display panels (i.e. EL display or liquid crystal display panels), what is being commercialized lately are cellular phones and PDAs having designs which allow a user to keep the phone folded, so that key pad and display panel portions overlap each other during time of non-use (standby time). In addition, recently, there has been an advent of a design providing an additional small display panel on the back side of the aforementioned display panel, so as to allow information to be displayed even while the folded-type cellular phone or PDA is in the folded state (time of non-use).

Products called two-sided display type display devices are being developed as display devices that are suitable for use in cellular phones and PDAsz having a second display panel (also referred to as a sub display panel or sub panel) in addition to a conventional display panel (also referred to as a main display panel or main panel), in which the two display panels are arranged oppositely in a back-to-back manner.

Examples of two-sided display type display device, such as one using a liquid crystal display panel as the main display panel and an EL display panel as the sub display panel, and a cellular phone employing such a device are described in JP-A-10-208884 and JP-A-2001-092390.

Furthermore, examples of two-sided EL display device, such as one that emits light from one luminescent layer (organic EL array) formed within an EL display panel toward both sides thereof, are described in JP-A-2002-252089, JP-A-2001-345184 and JP-A-2002-289362. Also, FIG. 5 of JP-A-2002-289362 illustrates a two-sided EL display device in which two luminescent layers respectively emit light to the two sides.

SUMMARY

However, in a display device of this type, there has been some difficulty in obtaining a thinner organic EL display device when the two-sided display type display device is constructed from organic EL panels, because it requires a device thickness to accommodate two sealing substrates, due to its sealing structure.

Furthermore, in an organic display panel using an organic EL material, a desiccant must be provided within the display panel prior to sealing, in order to prevent degradation of the device characteristics, such as the life time etc. thereof, caused by elements in the atmosphere, such as $H_2O$ and $O_2$, so that the thickness of the organic EL display panel inevitably increases. Also, since two organic EL substrates are required in order to realize a two-sided display type display device, there has been some difficulty in making the organic EL display device thinner.

FIG. 5 of JP-A-2002-289362 illustrates a configuration which combines the two organic EL substrates into one organic EL substrate, and anode electrodes and cathode electrodes are formed on both sides of this one organic EL substrate, which is sandwiched between two sealing substrates. However, this means that, on this organic EL substrate, both the anode and cathode electrodes, or at least either of the electrodes, would be formed. Also, in an active matrix type display device, an insulating layer made of a silicon film, SiN or SiNO, which has a large effect the device characteristics, is formed. Furthermore, in the manufacturing method for depositing three colors emissions in a mosaic pattern, a ridge called a bank is formed over the organic EL substrate so as to surround the pixels. Accordingly, the device characteristics may be significantly degraded when organic EL substrates having such various structures, that largely affect the device characteristics, are combined into one substrate. For example, there is a possibility of the threshold of TFT being varied, or the organic layers' life time shortened, etc. It is difficult to establish a production process to form the various structures on both sides of one EL substrate without increasing the risk of incurring such problems, and, if such is attempted, that may significantly degrade the productivity. Accordingly, the configuration of FIG. 5 of the JP-A-2002-289362 is hardly recognized as a configuration that considers the reliability and the simplification of the production process of the organic EL display device.

Thus, the invention was made in order to resolve the above-described problems, and its object is to realize an organic EL display device in which reduction of the thickness and weight of an organic display panel itself is achieved through simple processes.

The invention includes a plurality of aspects to achieve this object. The following are some representative features thereof.

(1) In a first aspect, an organic EL display device is made has a configuration that includes a sealing substrate having a first concave portion on one side and a second concave portion on the opposite side of the first concave portion; a first transparent substrate hermetically sealed over the periphery of the first concave portion via a sealant; a first organic EL light emitting element formed on the inner surface of the first transparent substrate; a first absorption layer disposed on the bottom surface of the first concave portion; a second transparent substrate hermetically sealed over the periphery of the second concave portion via a sealant; a second organic EL light emitting element formed on the inner surface of the second transparent substrate; and a second absorption layer disposed on the bottom surface of the second concave portion.

(2) In a second aspect, an organic EL display device includes a sealing substrate having a first concave portion on one side, a second concave portion on the opposite side of the first concave portion and at least one opening to allow communication between the first and second concave portions; a first transparent substrate hermetically sealed over the periphery of the first concave portion via a sealant; a first organic EL light emitting element formed on the inner surface of the first transparent substrate; a second transparent substrate hermetically sealed over the periphery of the second concave portion via a sealant; a second organic EL light emitting element formed on the inner surface of the second transparent substrate; and an absorption layer disposed on the bottom surface of either one of the first and second concave portions.

(3) In a third aspect, an organic EL display device includes a sealing substrate having a first concave portion on one side and a second concave portion on the opposite side of the first concave portion; a first transparent substrate hermetically sealed over the periphery of the first concave portion via a sealant; a first organic EL light emitting element formed on the inner surface of the first transparent substrate; at least one first absorption layer disposed on the inner surface of the first transparent substrate, except in the area of the first organic EL light emitting element; a second transparent substrate disposed oppositely to the first transparent substrate with a given distance therebetween and hermetically sealed over a periphery via a sealant; a second organic EL light emitting element formed on the inner surface of the second transparent substrate and having a larger light emitting area than the first EL light emitting element; and a second absorption layer disposed on the bottom surface of the second concave portion. The use of a common sealing substrate in all of the first through fourth aspects realizes, not only a reduction of the material cost, but also the use of organic EL elements of high quality, which have a long duration, which require rigorous manufacturing processes and greatly affect the life time and reliability, provided only on one side of respective substrates that may then be placed on the top and bottom of the common sealing substrate. Thus, a highly reliable thin-type both-sided organic EL display device can be easily provided.

Furthermore, the invention also includes, beside the above-described first through third aspects, as a way to reduce the number of sealing substrates relative to the number of organic EL substrates, an organic EL display device including a first transparent substrate; a first organic EL light emitting element formed on an inner surface of the first transparent substrate; at least one absorption layer disposed over the inner surface of the first transparent substrate, except in the area of the first organic EL light emitting element; a second transparent substrate disposed opposite to the first transparent substrate with a given distance therebetween and hermetically sealed over the periphery via a sealant; and a second organic EL light emitting element formed on the inner surface of the second transparent substrate and having a larger light emitting area than the first EL light emitting element.

It shall be noted that the invention is not limited to the above-mentioned configurations and the configurations later described with respect to various embodiments, and various modifications may be made thereto without departing from the technical concepts of the invention.

DETAILED DESCRIPTION OF THE INVENTION

Specific embodiments of the invention will be described in detail hereinafter with reference to the drawings.

Embodiment 1

Figure 1A:
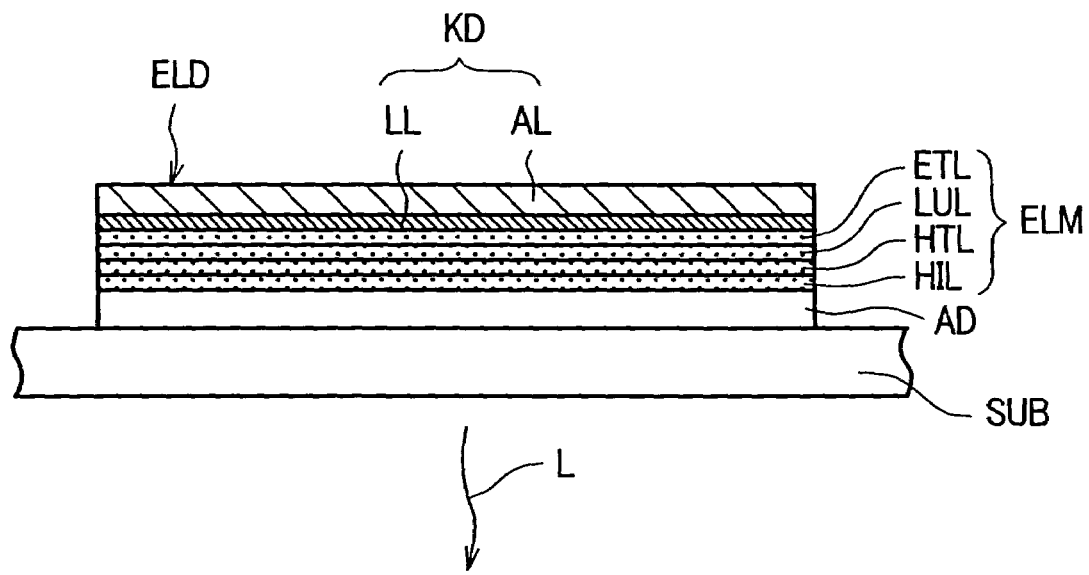
FIGS. 1A and 1B are cross-sectional views showing a simplified layer structure of an exemplary organic EL light emitting element of an organic EL display device according to the present invention.
Figure 1B:
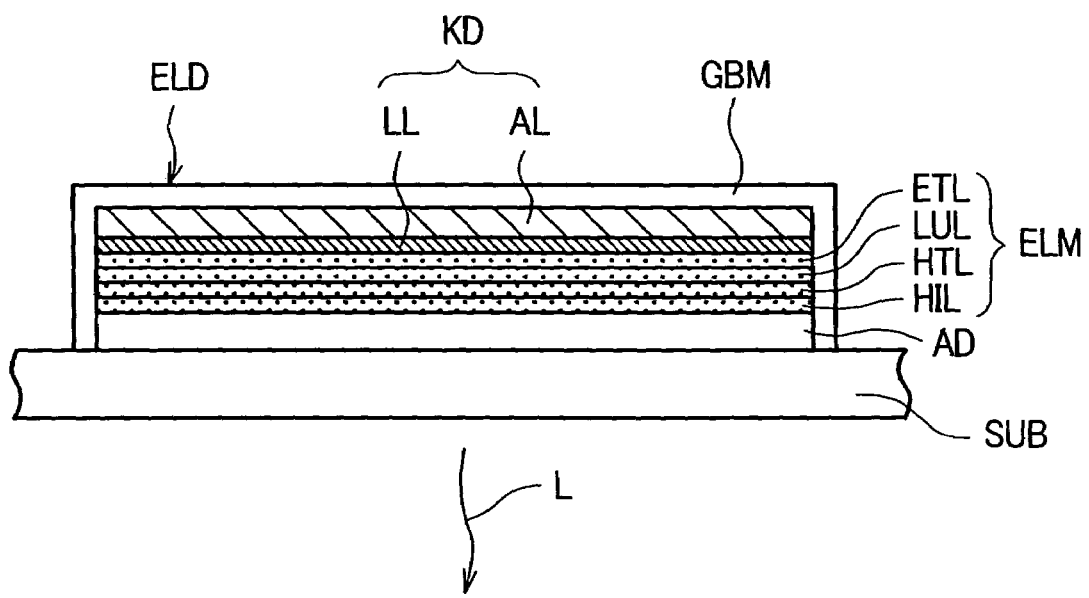
Figure 2:
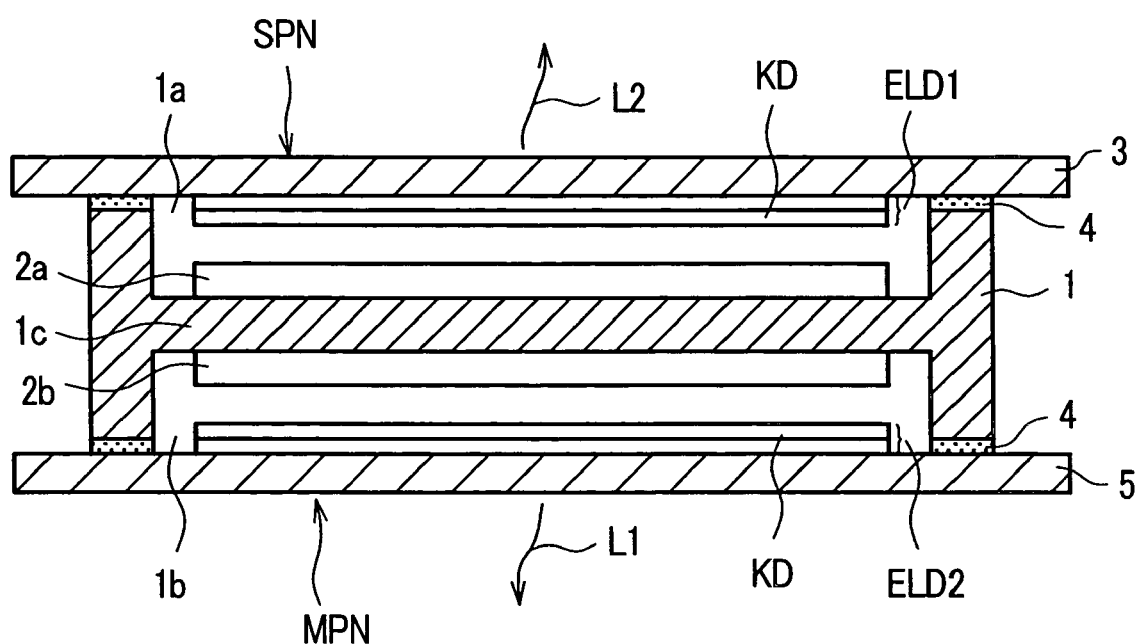
FIG. 2 is a cross-sectional view showing a simplified configuration of an organic EL display device representing a first embodiment according to the present invention.

FIGS. 1A and 1B are simplified cross-sectional views showing a layer structure of an active matrix type organic EL light emitting element according to a first embodiment of an organic EL display device, in which only one pixel is shown. Although the EL light emitting element also includes a switching device for selecting pixels and a controlling device for controlling the luminescence of emission, these elements are omitted for simplification of the description. Furthermore, FIG. 2 is a simplified cross-sectional view of the whole structure of the organic EL display device of the shown in FIGS. 1A and 1B.

The organic EL light emitting element ELD, that forms the organic EL display device, as shown in FIG. 1A, includes an anode AD, which is also referred to as a bottom electrode made of a transparent conductive film (thin film), such as ITO (In—Ti—O), formed over a principal surface of a transparent glass substrate SUB; and, over this anode AD, an organic multilayer film ELM, which constitutes an organic light emitting structure of the organic EL light emitting element ELD, is formed. This organic multilayer film ELM is a lamination of, from the side of the anode AD, a hole injection layer HIL made of a thin film of an organic material, a hole transport layer HTL, a organic EL luminescent layer LUL and an electron transport layer ETL; and, formed over this electron transport layer ETL, there is a cathode KD, which is also referred to as an upper electrode, serving as a light emission controlling electrode.

Further, in the structure of FIG. 1A, as another organic EL light emitting element that may form this organic EL display device, there is a gas barrier membrane GBM serving as a top layer which is disposed so as to cover the anode AD, the organic multilayer film ELM and the cathode KD, as shown in FIG. 1B. This gas barrier membrane GBM is constituted by a gas-nonpermeable material layer, such as a polymer layer, a silicon nitride layer or a silicon oxide layer, which, especially, prevents the organic multilayer film ELM from absorbing moisture and gaseous elements from within the external atmosphere, so that the degradation of its luminescence properties due to such absorption may be prevented. Furthermore, after the formation of the gas barrier membrane GBM, a metal film, not shown, having a high thermal conductivity, may be formed over the surface of the gas barrier membrane GBM. The formation of this metal film allows internal heat generated by the emission of light to be dissipated into the transparent glass substrate SUB, so that extension of the life-time of the organic multilayer film ELM can be expected.

The thickness of the organic multilayer film ELM is approximately 100 µm, for example. The cathode KD is formed from a lithium fluoride (LiF) layer LL, positioned as a first layer from the side of the electron transport layer ETL, and an aluminum (AL) layer AL formed on the lithium fluoride layer LL as a second layer. The thickness of the lithium fluoride layer LL is approximately 1 nm, for example, and the thickness of the aluminum layer AL is approximately 200 nm, for example. The thicknesses of the gas barrier membrane GBM and the metal film formed as the top layer are in the order of several µm.

The following are exemplary materials for the above-described organic multilayer film ELM. That is, for example, CuPc (copper phthalocyanine) is used for the hole injection layer HIL. For the hole transport layer HTL, alpha-NPD (alpha-naphthylphenyldiamine) is used, for example. For the luminescent layer LUL, a luminescent material, using 9,10-diphenylanthracene, for example, as a host material, and perylene is used as a dopant. As for the electron transport layer ETL, $Alq_3$ (tris (8-hydro-oxyquinoline) aluminum) is used, for example.

The organic EL light emitting element ELD, configured in this manner, induces illumination of the luminescent layer LUL by the transportation of holes from the hole injection layer HIL to the luminescent layer LUL, upon application of a given voltage between the cathode KD and the anode AD, and electrons are injected from the electron transport layer ETL, so that light from the transparent glass substrate SUB is emitted outwardly as luminescent light L.

Next, in the organic EL display device using these organic EL light emitting elements ELD, as shown in FIG. 2, a sealing glass substrate 1, which is used to accommodate the organic EL light emitting elements ELD, has a first concave portion 1a having an opening on the upper surface, and a second concave portion 1b having an opening on the bottom surface, which is an opposite surface relative to the first concave portion 1a. Thus, a supporting portion 1c is integrally formed, which shares the bottom portions of the first concave portion 1a and the second concave portion 1b, so that the cross-section thereof has approximately an H-shape. The first concave portion 1a and second concave portion 1b are formed in a flat-plate type glass substrate through a process such as a sand blasting, etching or integral molding method. The depths of the first and second concave portions 1a and 1b are approximately 300 µm, for example.

To the sealing glass substrate 1, a desiccant 2a, which serves as an absorbent, is accommodated within the first concave portion 1a at the bottom surface thereof (supporting portion 1c), being adhered thereto by an adhesive, and a desiccant 2b, which serves as an absorbent, is accommodated within the second concave portion 1b at the bottom surface thereof (supporting portion 1c), being adhered thereto by an adhesive. The thicknesses of these desiccants 2a and 2b are, approximately 100 µm, for example. The desiccants 2a and 2b are formed by making a known type of desiccant into the shape of a sheet and affixing it on the each side of the supporting portion 1c by an adhesive, however, it is also possible to use a gel-type desiccant which may be applied by coating.

Furthermore, the sealing glass substrate 1 is disposed on the transparent glass substrate 3 via a sealant (an adhesive made of a UV cured resin) 4.

The transparent glass substrate 3 has a thickness of approximately, 700 µm, for example, and it comprises a first group of organic EL elements on its principal surface. The first group organic EL elements faces the concave portion of the sealing glass substrate 1 via a gap. At least one part of the cathodes KD of the first group organic EL elements faces the desiccant disposed on the first concave portion 1a via the gap.

The sealant 4 is applied over the periphery of the sealing glass substrate 1, and it is cured by irradiating a UV beam thereon to integrally affix the both substrates to provide a hermetic sealing, thereby constituting a panel SPN.

Furthermore, over an inner principal surface of a transparent glass substrate 5, which faces the second concave portion 1b of the sealing glass substrate 1, a second group of organic EL light emitting elements ELD2, such as the one shown in FIGS. 1A and 1B, is formed, so that the cathode KD side thereof faces the desiccant 2b, and a sealant (an adhesive made of a UV cure resin) 4 is applied over the periphery of the sealing glass substrate 1. The sealant is cured by irradiating a UV beam thereon to integrally affix both substrates to provide a hermetic seal, thereby constituting a panel MPN. The thickness of the transparent glass substrate 5 is approximately 700 µm, for example. As for the sealant 4, a UV cured resin is used in the embodiment, however any other sealant may also be used.

In the configuration such as described above, since a two-sided EL display panel may be produced by sandwiching the sealing glass substrate 1 between the main display panel MPN and the sub display panel SPN, different images L1 and L2 may be displayed on the main display panel MPN and the sub display panel SPN by externally supplying different driving signals thereto, respectively.

According to this configuration, by causing the desiccants 2a and 2b, respectively, to adhere to the bottoms of the sealing glass substrate 1 at the concave portions 1a and 1b on the respective surfaces, and attaching the transparent substrates 3 and 5, having the organic EL light emitting elements ELD1 and ELD2 formed respectively thereon, to the respective concave portions, the first sealing glass substrate 1 is shared, and an integral two-sided organic EL display device may be realized, thereby achieving a reduction in the thickness down to a thickness equivalent to that of the current single sealing substrate.

Figure 3A:
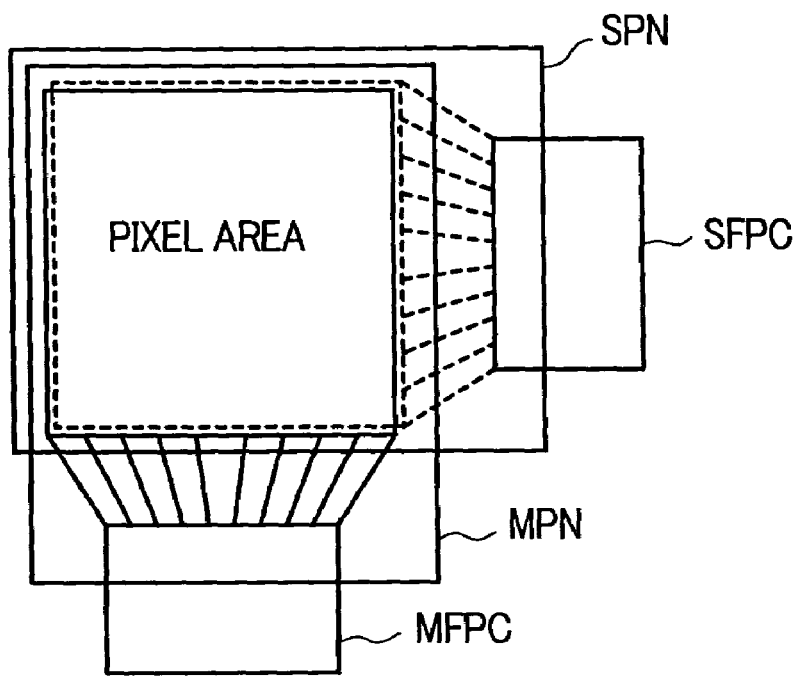
FIGS. 3A and 3B are plan views showing means for connecting driving signals supplied from respective external driving circuits to a main display panel and a sub display panel of the organic EL display device shown in FIG. 2.
Figure 3B:
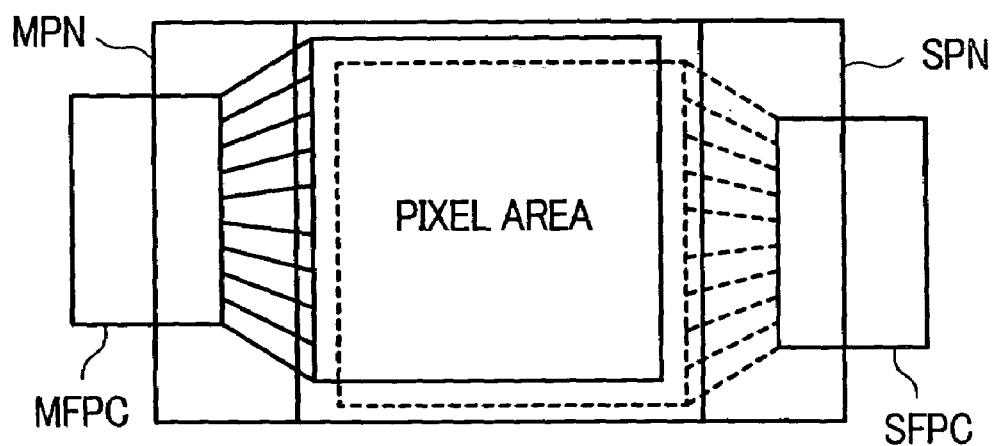

FIGS. 3A and 3B represent plan views of means for connecting driving signals supplied from external driving circuits respectively to the main display panel MPN and the sub display panel SPN of the organic EL display device illustrated in FIG. 2. As shown in FIGS. 3A and 3B, the organic EL display device shown in FIG. 2 is realized by displacing pressure-bonded sections of a main display panel flexible wire MFPC and a sub display panel flexible wire SFPC, that are to be connected with respective electrode terminals, not shown, of the pixel area, in vertical or horizontal direction according to the design.

Embodiment 2

Figure 4:
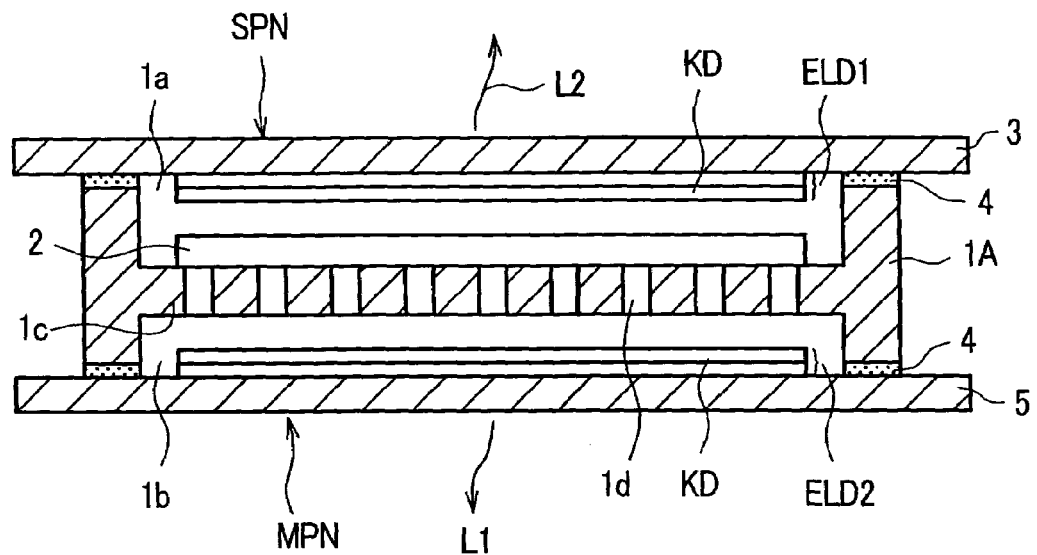
FIG. 4 is a cross-sectional view showing a simplified configuration of a second embodiment of an organic EL display device according to the present invention.

FIG. 4 is a simplified cross-sectional view showing the entire structure of a second embodiment of the organic EL display device according to the invention, in which elements identical to those in FIG. 2 are indicated by identical reference numerals as those used in FIG. 2, and a repeated description thereof will be omitted. The structure in FIG. 4 is different from that shown in FIG. 2 in that there are a plurality of openings 1d in the supporting portion 1c shared by the bottom surfaces of the first concave portion 1a and the second concave portion 1b, thereby allowing communication between these openings.

Furthermore, at the bottom surface (supporting portion 1c) of the first concave portion 1a, a desiccant 2 is accommodated through the use of an adhesive so as to block the plurality of the openings 1d, and no desiccant is provided on the bottom surface (supporting portion 1c) of the second concave portion 1b. Accordingly, it is configured such that the desiccant 2 is capable of applying its absorbing ability in both the first concave portion 1a and the second concave portion 1b. The thickness of this desiccant 2 is approximately 100 μm, for example. Also, the desiccant 2 may be any of known desiccant material that has been formed in a sheet shape and is adhered to the bottom surface of the concave portion 1a, or it may also be a gel-type desiccant which may be applied by coating.

With this configuration, the ability to absorb any moisture and gaseous elements in the air may be obtained by placing only one piece of desiccant 2 on the bottom surface of the first concave portion 1a, so that the thickness of the sealing glass substrate 1 may be further reduced to achieve a slimmer body, and also the production cost may be reduced because only one desiccant 2 is required. The same effect may be obtained when the desiccant 2 is accommodated on the bottom surface of the second concave portion 1b, instead of the first concave portion 1a.

Embodiment 3

Figure 5:
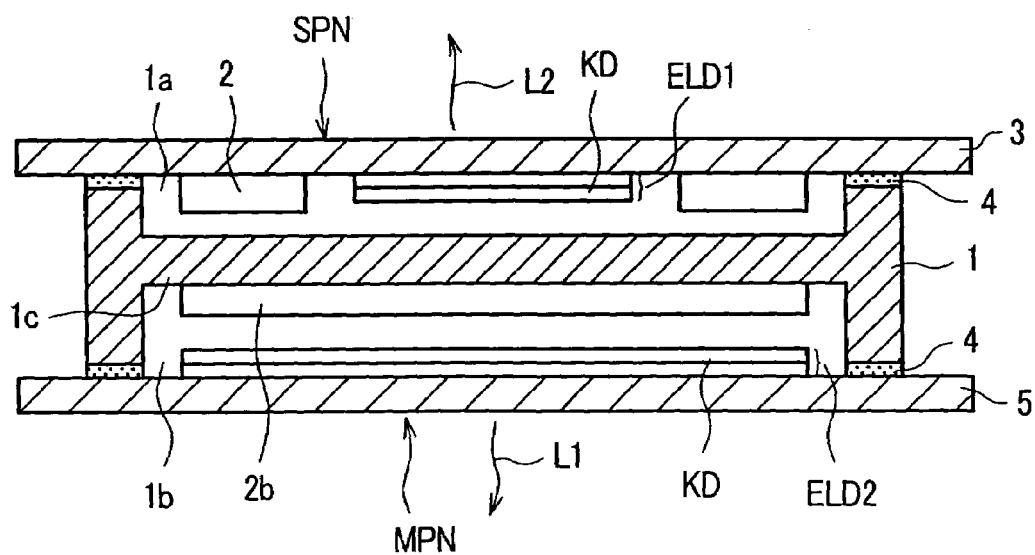
FIG. 5 is a cross-sectional view showing a simplified configuration of a third embodiment of an organic EL display device according to the present invention.

FIG. 5 is a simplified cross-sectional view illustrating an organic EL display device according to a third embodiment of the invention, in which elements identical to those shown in FIG. 2 are indicated by identical numerals as those used in FIG. 2, and a repeated description thereof will be omitted. FIG. 5 is different from FIG. 2 in that, in FIG. 5, an organic EL light emitting element ELD1, having a luminescent region smaller than that of the organic EL light emitting element ELD2, is formed over the inner principal surface of a transparent glass substrate 3, and a desiccant 2 is adhered around the circumference of the organic EL light emitting element ELD1 using an adhesive so as to surround the organic EL light emitting element ELD1.

Figure 6:
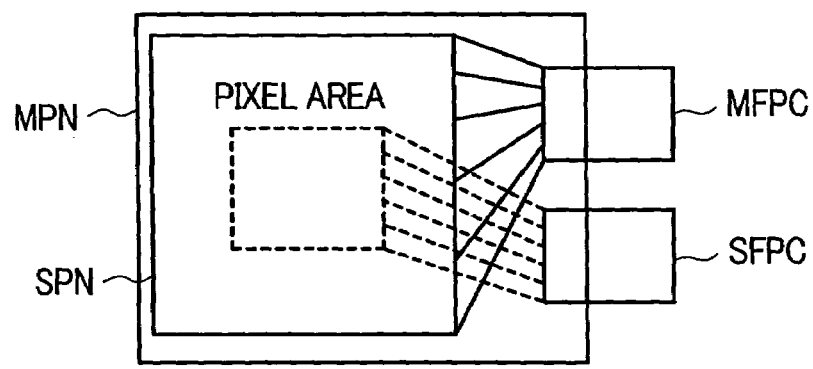
FIG. 6 is a plan view showing means for connecting driving signals supplied from respective external driving circuits to a main display panel and a sub display panel of the organic EL display device shown in FIG. 5.

FIG. 6 is a plan view illustrating means to connect driving signals supplied to the main display panel MPN and to the sub display panel SPN of the organic EL display device illustrated in FIG. 5, respectively, from external driving circuits; and, as shown in FIG. 6, by displacing, according to the design, pressure-bonded sections between a main display panel flexible wire MFPC and a sub display panel flexible wire SFPC, that are connected to respective electrode terminals (not shown) in the pixel portion, the organic EL display device shown in FIG. 5 is realized.

With this configuration, since a two-sided display type display device is realized, in which the main display panel MPN having a larger display area and the sub display panel SPN having a smaller display area are overlapped over the sealing glass substrate 1, the images L1 and L2 respectively having different display sizes for the main display panel MPN and the sub display panel SPN may be obtained by externally supplying driving signals to the respective main display panel MPN and sub display panel SPN.

According to this configuration, by adhering the desiccant 2 so as to surround the organic EL light emitting element ELD1 having a smaller display area, that has been formed over the inner surface of the transparent glass substrate 3, there no longer is a need to adhere it on the bottom surface of the first concave portion 1a, which, in turn, allows the first concave portion 1a of the sealing glass substrate 1 to be shallower to that extent, thereby realizing a smaller thickness of the sealing glass substrate 1, which, in turn, realizes a slimmer body.

Embodiment 4

Figure 7:
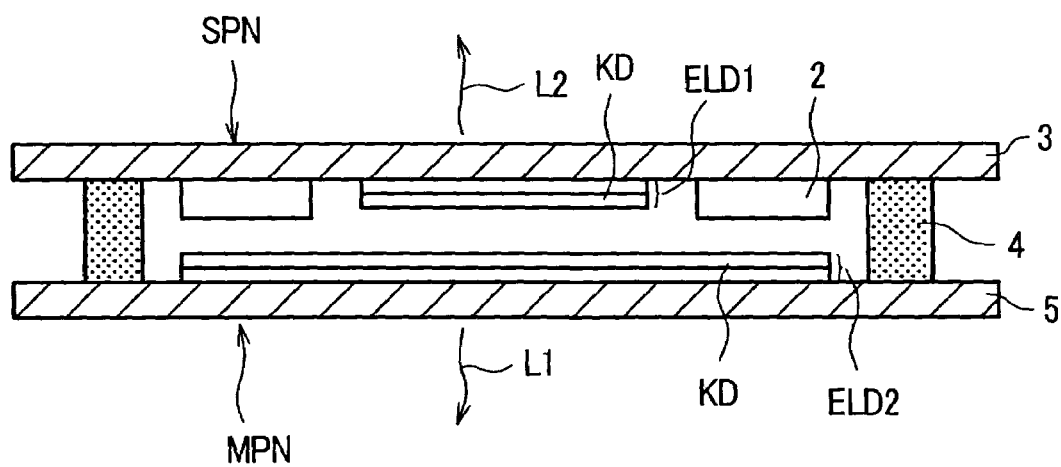
FIG. 7 is a cross-sectional view showing a simplified configuration of a fourth embodiment of an organic EL display device according to the present invention.

FIG. 7 is a simplified cross-sectional view illustrating the entire structure of an organic EL display device according to a fourth embodiment of the invention, in which elements identical to those in FIG. 5 are designated by the identical reference numerals as shown in FIG. 5, and repeated descriptions thereof will be omitted. FIG. 7 is different from FIG. 5 in that, in FIG. 7, the organic EL display device may be realized without the need of the sealing substrate 1, shown in FIG. 5, in a case of a two-sided display type display device, in which a main display panel MPN having a large display area and a sub display panel SPN having a small display area are overlapped, by hermetically sealing transparent glass substrates 3 and 5 using a sealant 4, which works also as a spacer, to allow the main display panel MPN and the sub display panel SPN to share a desiccant 2, which is adhered to an organic EL light emitting element ELD1 in a way so as to surround the organic EL light emitting element ELD1 formed over the inner surface of the transparent glass substrate 3.

In this configuration, since the one desiccant 2 that adheres on the inner surface of the transparent glass substrate 3 will provide a function of absorbing moisture and gaseous elements within the air, and since the two-sided display type display device may be constructed without the need of the sealing glass substrate 1 shown in FIG. 5, further slimming and further reduction of the manufacturing cost due to the use of only one desiccant 2 may be realized.

Figure 8:
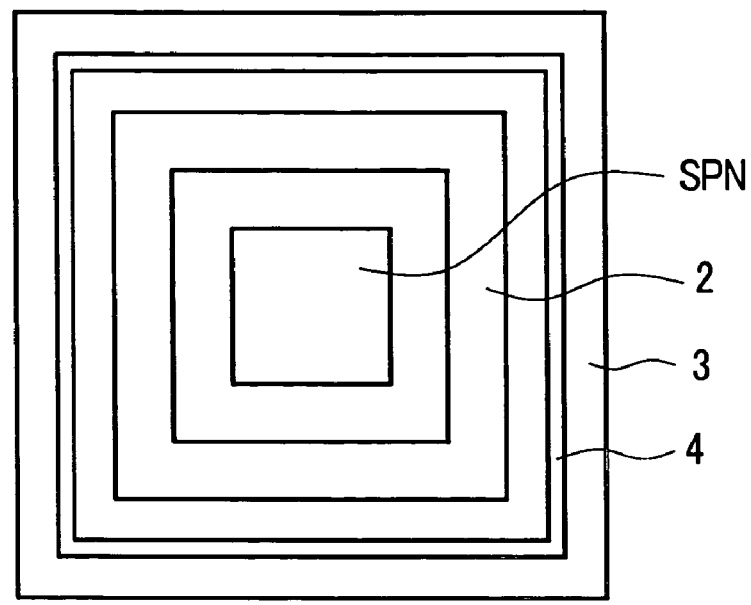
FIG. 8 is a plan view as seen from the side of a sub display panel, showing one embodiment of the scheme for placement of desiccant which may be used in the organic EL display device shown in FIG. 7.
Figure 9:
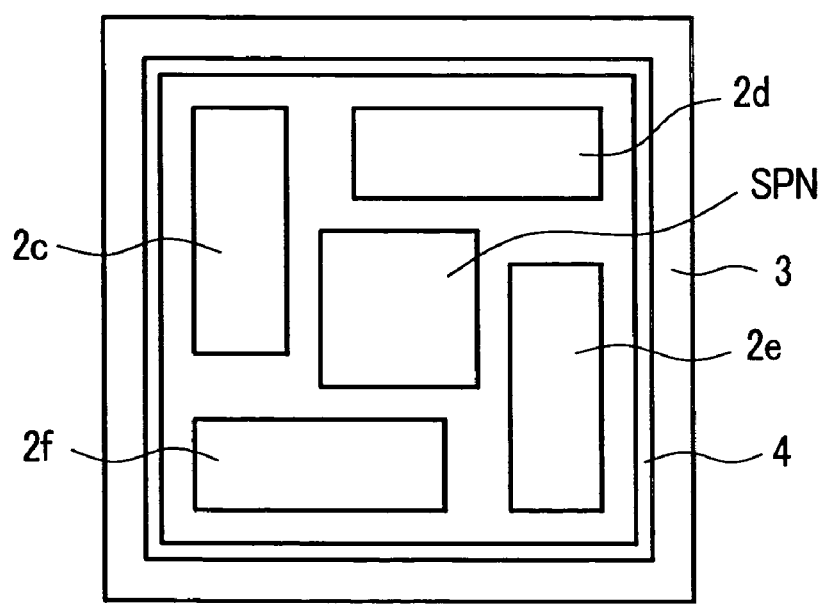
FIG. 9 is a plan view as seen from the side of a sub display panel, showing another embodiment of the scheme for placement of the desiccant which may be used in the organic EL display device shown in FIG. 7.
Figure 10:
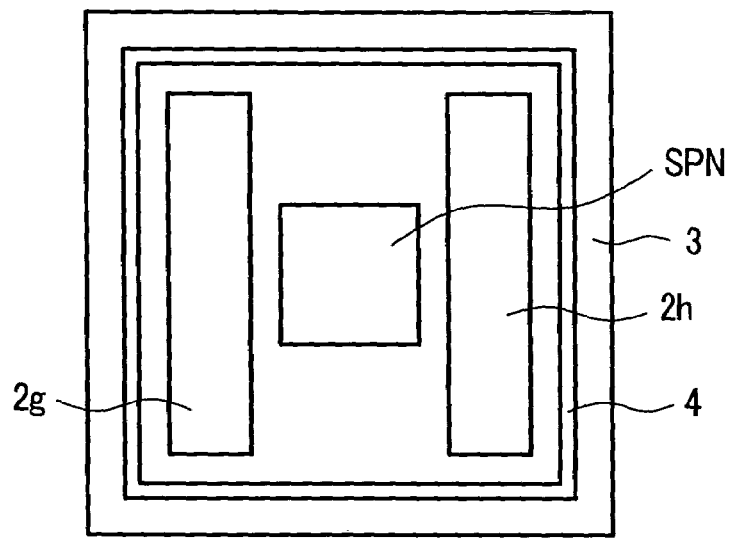
FIG. 10 is a plan view as seen from the side of a sub display panel, showing a further embodiment of the scheme for placement of the desiccant which may be used for the organic EL display device shown in FIG. 7.

FIGS. 8 through 10 are plan views illustrating exemplary placement positions of the desiccant used in the organic EL display device of FIG. 7, as viewed from the side of the sub display panel SPN. As shown in FIG. 8, the placement position of the desiccant 2 that adheres to the inner surface of the transparent substrate 3 surrounds the periphery of the sub display panel SPN. Also, as shown in FIG. 9, a plurality of desiccants 2c-2f may be positioned so as to surround the periphery of the sub display panel SPN. Furthermore, as shown in FIG. 10, the desiccants may be positioned on the opposing sides so as to surround the periphery of the sub display panel SPN. The desiccants 2, 2c-2f, 2g, 2h are not limited to any particular number or shape.

Embodiment 5

Figure 11:
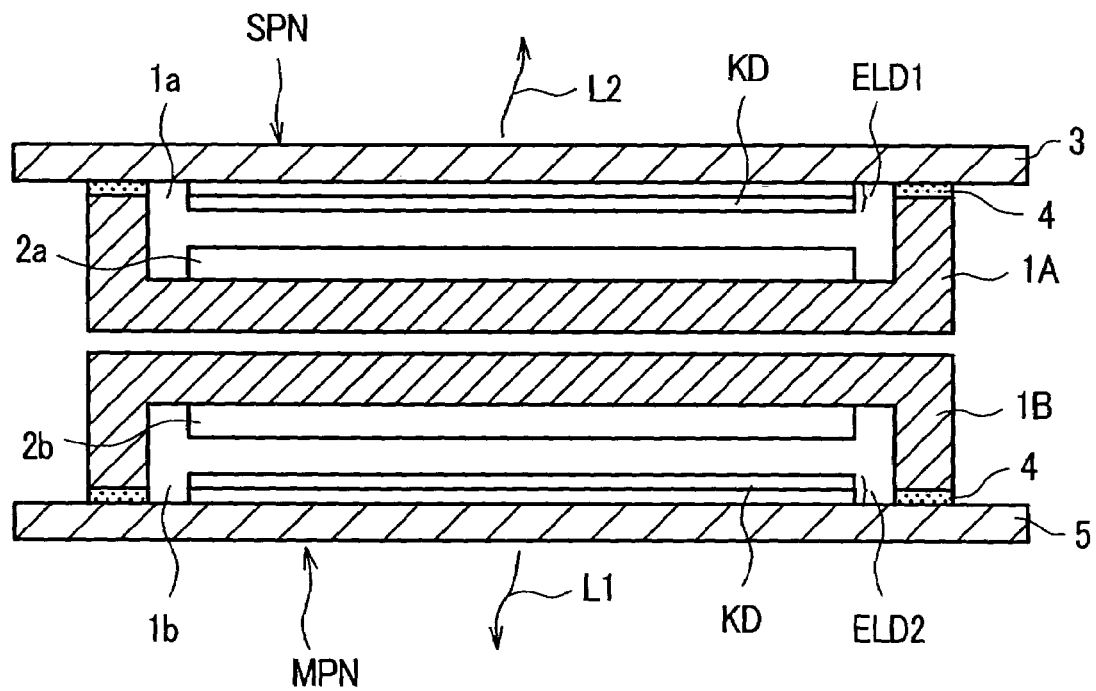
FIG. 11 is a cross-sectional view showing a simplified configuration of a fifth embodiment of an organic EL display device according to the present invention.

FIG. 11 is a simplified cross-sectional view illustrating the entire structure of an organic EL display device according to a fifth embodiment of the invention, in which any elements identical to those in FIG. 2 are designated with the identical reference numerals as used in FIG. 2, and a repeated description thereof will be omitted. FIG. 11 is different from FIG. 2 in that, in FIG. 11, the sealing glass substrate 1 that has been formed to have roughly an H-shaped cross section, as shown in FIG. 2, is now divided into a first sealing glass substrate 1A having a bottom surface forming the concave portion 1a and a second sealing glass substrate 1B having a bottom surface forming the concave portion 1b, thereby respectively forming a main display panel MPN and a sub display panel SPN that are independent from each other. The main display panel MPN and the sub display panel SPN are adjoined at their back sides to form a two-sided display structure.

This configuration realizes a two-sided EL display panel that can achieve a slimmer body, in which the main display panel MPN and the sub display panel SPN are overlapped at their back sides. Accordingly, by externally supplying driving signals to the main display panel MPN and the sub display panel SPN, respectively, images L1 and L2 that are different from each other may be displayed on the main display panel MPN and the sub display panel SPN.

Although the embodiments have heretofore been described as using an organic EL light emitting element ELD having a structure corresponding to the organic EL light emitting elements ELD1 and ELD2 shown in FIG. 1A, the invention is not limited thereto, and the same effects may be obtained from the use of an organic EL light emitting element ELD in which a gas barrier membrane GBM is formed as its top layer to cover the anode AD, organic multilayer ELM and cathode KD, as shown in FIG. 1B. In this case, an effect of interception may be obtained over the organic EL light emitting element ELD against moisture and gaseous elements in the external atmosphere.

Also, in each of the above-described embodiments, a desiccant(s) is used as an absorbent layer, however, the invention is not limited to this configuration, and instead of a desiccant, diatom earth, siliceous earth, or a mixture thereof may be used in the form of a sheet to be adhered to a substrate, or in a gel state to be applied by coating thereto.

Furthermore, each of the above embodiments has been explained as being used in an active matrix type organic EL display device, however, the invention is not limited thereto, and it should be noted that the invention may also be applied to a passive type organic EL display device. Similarly, each of the above-described embodiments has been explained as using a two-sided organic EL display panel in which top and back organic EL display substrates are combined, as an organic EL display device; however, it should be noted that the invention is not limited thereto, and its application may also be found in those organic EL panels for miniature data terminals (cellular phones, PDAs etc.) in which portability is valued, or in a variety of organic EL displays for monitors.

The invention claimed is:

1. An organic EL display device comprising:
   two transparent substrates each including an organic light emitting element including a first electrode, a second electrode, and an organic film formed between the first electrode and the second electrode; and
   a sealing substrate for sealing each of said organic light emitting elements;
   wherein respective surfaces of said sealing substrate and surfaces of said transparent substrates on which said organic light emitting elements are formed, are positioned facing each other;
   a first absorbent layer disposed over one surface of said sealing substrate; and
   a second absorbent layer disposed over an inner surface of one of the two transparent substrates in an area other than the area of the one of the organic light emitting element.

2. An organic EL display device according to claim 1, said sealing substrate having a first concave portion on one surface and a second concave portion on an opposite surface of said first concave portion.

3. An organic EL display device according to claim 1, wherein a third absorbent layer disposed over the another surface of said sealing substrate.

* * * * *